United States Patent [19]

Ju et al.

[11] Patent Number: 5,841,957
[45] Date of Patent: Nov. 24, 1998

[54] PROGRAMMABLE I/O REMAPPER FOR PARTIALLY DEFECTIVE MEMORY DEVICES

[75] Inventors: Jiang-Tsuen Ju; Shih J. Chien, both of Hsin-Chu, Taiwan

[73] Assignee: Acti Technology Corp., Taipei, Taiwan

[21] Appl. No.: 652,390

[22] Filed: May 23, 1996

[51] Int. Cl.$^6$ .................................................. G06F 13/00
[52] U.S. Cl. .................................. 395/182.06; 371/21.6
[58] Field of Search ..................... 395/182.06, 182.03; 371/21.6; 5/21.1

[56] References Cited

U.S. PATENT DOCUMENTS

| | | | |
|---|---|---|---|
| 4,355,376 | 10/1982 | Gould | 365/200 |
| 4,446,534 | 5/1984 | Smith | 365/96 |
| 4,471,472 | 9/1984 | Young | 365/20 |
| 4,527,251 | 7/1985 | Nibby, Jr. et al. | 364/900 |
| 5,134,584 | 7/1992 | Boler et al. | 365/200 |
| 5,602,987 | 2/1997 | Harari et al. | 395/182.06 |
| 5,644,541 | 7/1997 | Sin et al. | 365/200 |

*Primary Examiner*—Robert W. Beausoliel, Jr.
*Assistant Examiner*—Norman M. Wright
*Attorney, Agent, or Firm*—Rabin & Champagne, P.C.

[57] ABSTRACT

A programmable I/O remapper for mapping partially defective memory devices to a memory data bus of an electronic system is disclosed. The remapper apparatus includes at least one defective memory device responsive to control signals and address signals of the electronic system. A switch circuit including several electrical type switches is used for generating mapped data bits, which are coupled the memory data bus of the electronic system. A data register is used for storing enable signals to control the switches of the switch circuit.

17 Claims, 4 Drawing Sheets

PROGRAMMABLE I/O REMAPPER FOR PARTIALLY DEFECTIVE MEMORY DEVICES

BACKGROUND OF THE INVENTION

1. Field of the Invention

The present invention relates to a memory system, and more particularly to apparatus for mapping partially defective memory devices to a system data bus in an electronic system.

2. Description of the Prior Art

Memory device, such as a dynamic random access memory (DRAM), a static random access memory (SRAM), a read only memory (ROM), a programmable ROM (PROM), an erasable PROM (EPROM), an electrically EPROM (EEPROM) or a flash ROM, is one of the most important devices used in digital electronic systems such as computers or computer related peripherals. As the speed of central processing unit (CPU) increases and the function of the electronic system becomes more complicated, the width of the system data bus increases accordingly, therefore demanding a memory device with more input/output (I/O) data bits.

One or more types of aforementioned memory devices may be used in an electronic system. No matter what characteristics each type of the memory devices has, they are commonly specified by the width of the input/output (I/O) data bits and the depth of their storage space. For example, a 1M×16 memory device has 16 I/O data bits each having a corresponding outer pin, and has one mega words in depth.

In the electronic industry, the memory device still has higher price than most of the other electronic devices used nowaday. As one or more I/O bits of a memory device are defective, the memory device does not function well with other portion of the electronic system. Further, the probability of a failed memory device increases while the I/O data bits of the memory device increase, and therefore the fabricated memory devices are wasted.

A technique has been introduced for overcoming the problem mentioned above by using only those functional data bits from several defective memory devices. For example, if an electronic system requires 4M×8 bits memory space, two 4M×4 memory devices each having one defective I/O data bits and one 4M×4 memory device having two defective I/O data bits can equivalently replace two functional 4M×4 devices.

The aforementioned technique of using several defective memory devices in parallel can be implemented in many ways. One method for using the functional bits of the memory device is to wire those functional bits directly and independently to the system bus. Due to the great number of possible combinations, for example, 6 possible combinations for 2 defective bits out of 4 bits, and generally n!/m!(n−m)! combinations for m defective bits out of n bits, this method becomes impractical as the number n becomes large enough.

Another method for overcoming the aforementioned problem is to use the memory devices which have the same or almost the same functional bits, for example, those memory devices each having functional high nibble (four bits). The drawback of this method is its low utilization of the defective memory devices and its waste of some functional bits in the defective nibble.

There is still another method in the prior art. Several mechanical switches such as dual-in-line (DIP) switches or jumpers are used more flexibly to select the functional bits in the defective memory device. It is found that this method works well for a system having low system bits, such as a four-bit system, but does not work practically for a system having more than 16 system bits. For example, there are three 8-bit defective memory devices used in a 16-bit system. The number of defective bits in the memory devices are respectively L, M and N, supposing that (L+M+N) is less than or equal to 8. Therefore, five combinations of (L,M,N) are (1,1,6), (1,2,5), (1,3,4), (2,2,4) and (2,3,3). In the case of (1,1,6), the combinations of total I/O data bits is $C_1^8 \times C_1^8 \times C_6^8 = 8 \times 8 \times 28 = 1792$, in which $C_m^n$ is the compact form for $n!/m!(n-m)!$.

Following the same derivation, there are 12544 combinations for the case of (1,2,5), 31360 combinations for (1,3,4), 54880 combinations for (2,2,4), and 43904 combinations for (2,3,3). It is seen that the method becomes almost impossible to be utilized in an electronic system with 16 bits or more.

Therefore, a need has been arisen for efficiently and economically recycling the defective memory devices in the electronic system without compromising the performance.

SUMMARY OF THE INVENTION

A programmable I/O remapper for mapping partially defective memory devices to a memory data bus of an electronic system is disclosed. The remapper apparatus includes at least one memory device responsive to control signals and address signals of the electronic system, in which the memory device has several data bits and at least one of the data bits is defective, a switch circuit including several electrical type switches for generating mapped data bits coupled to the memory data bus of the electronic system, in which the number of the mapped data bits is not greater than the number of the non-defective data bits of the memory device, a data register for storing enable signals, which are coupled to the switch circuit to control the switches.

DESCRIPTION OF THE PREFERRED EMBODIMENT

Figure 1:
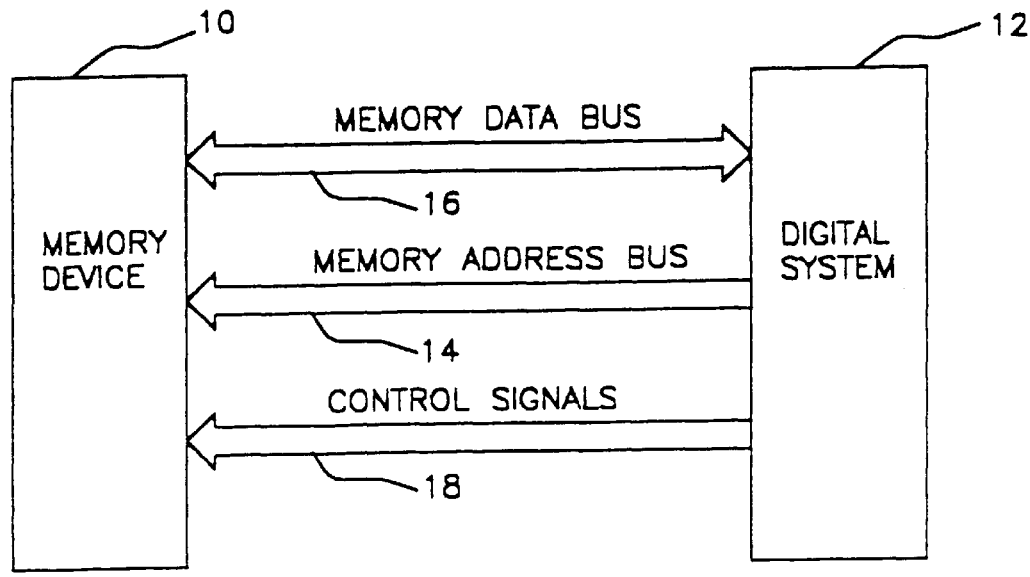
FIG. 1 is a block diagram of a conventional memory system.

FIG. 1 demonstrates a conventional system that a memory device 10, such as as a dynamic random access memory (DRAM), a static random access memory (SRAM), read only memory (ROM), a programmable ROM (PROM), an erasable PROM (EPROM), an electrically EPROM (EEPROM) or a flash ROM, is coupled to a digital system 12 through a memory address bus 14, a memory data bus 16 and some control signals 18. The memory device 10 is responsive to the control signals 18 and the accompanying address, and performs read or write cycle by receiving or sending data via the memory data bus 16.

Figure 2:
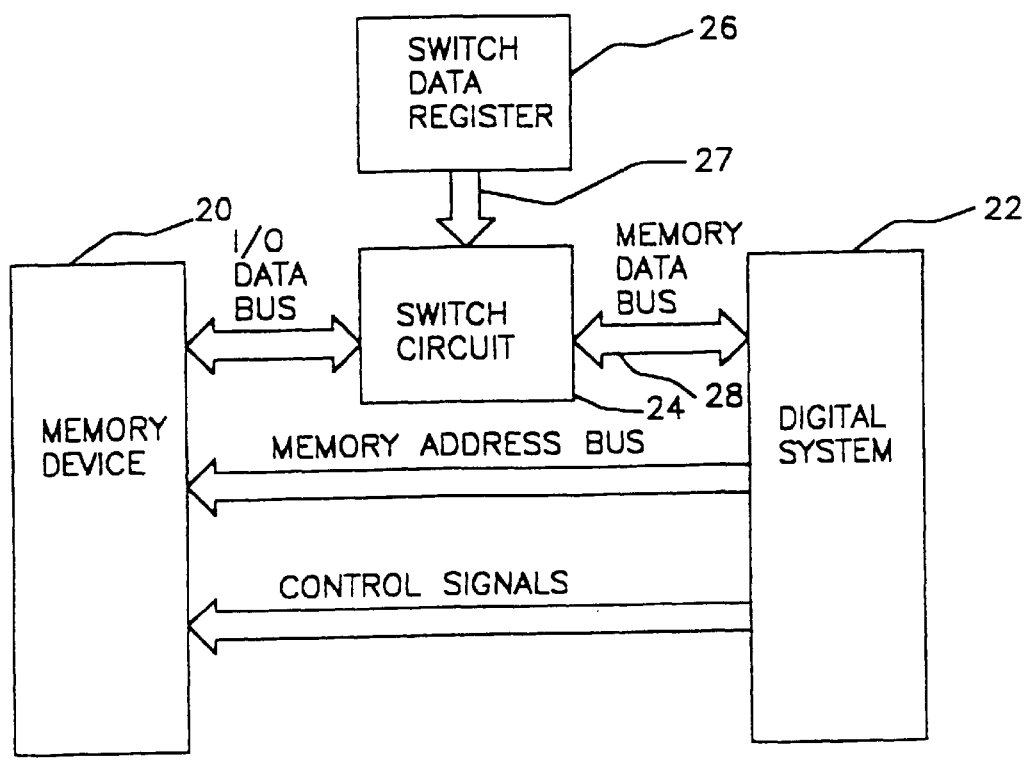
FIG. 2 shows one embodiment of present invention for using a defective memory device with a digital system

FIG. 2 shows one embodiment of present invention for using a defective memory device 20 with a digital system 22 via a switch circuit 24, which works as a programmable I/O remapper. The memory device 20 can be a dynamic random access memory (DRAM), a static random access memory (SRAM), a read only memory (ROM), a programmable ROM (PROM), an erasable PROM (EPROM), an electrically EPROM (EEPROM), a flash ROM, or any of these in combination. All I/O data bits, no matter they are functional ones or defective ones, are coupled electrically to the switch circuit 24, in which several electrical switches will route the functional I/O data bits to the memory data bus 28. Further, the electrical switches in the switch circuit 24 are controlled by some preset signals placed on a switch data register 26.

Figure 3:
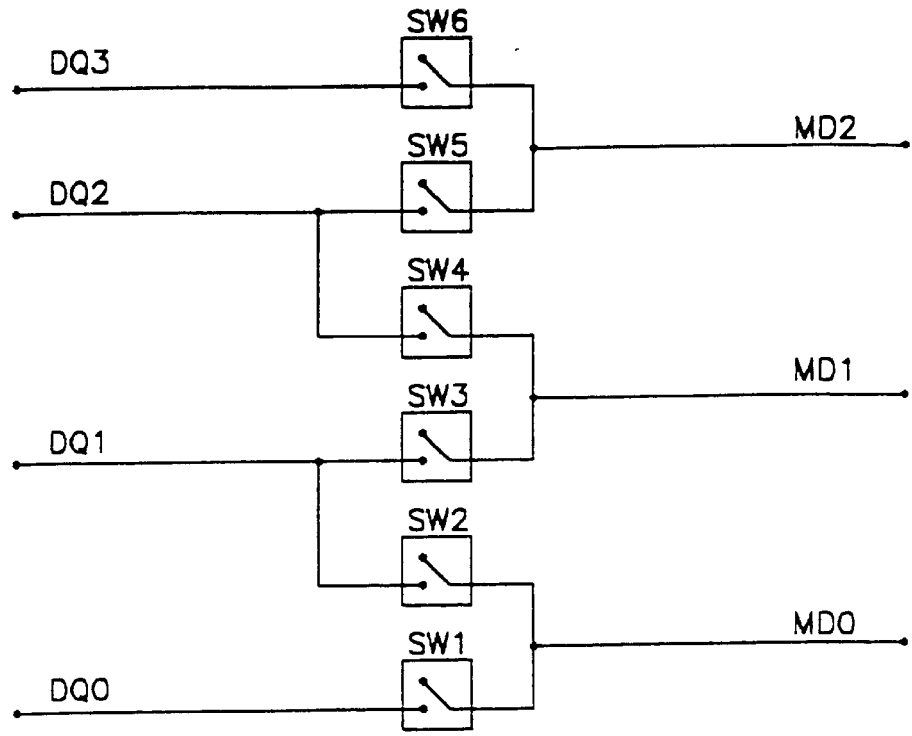
FIG. 3 shows one mapping example of the switch circuit in the present invention.
Figure 4:
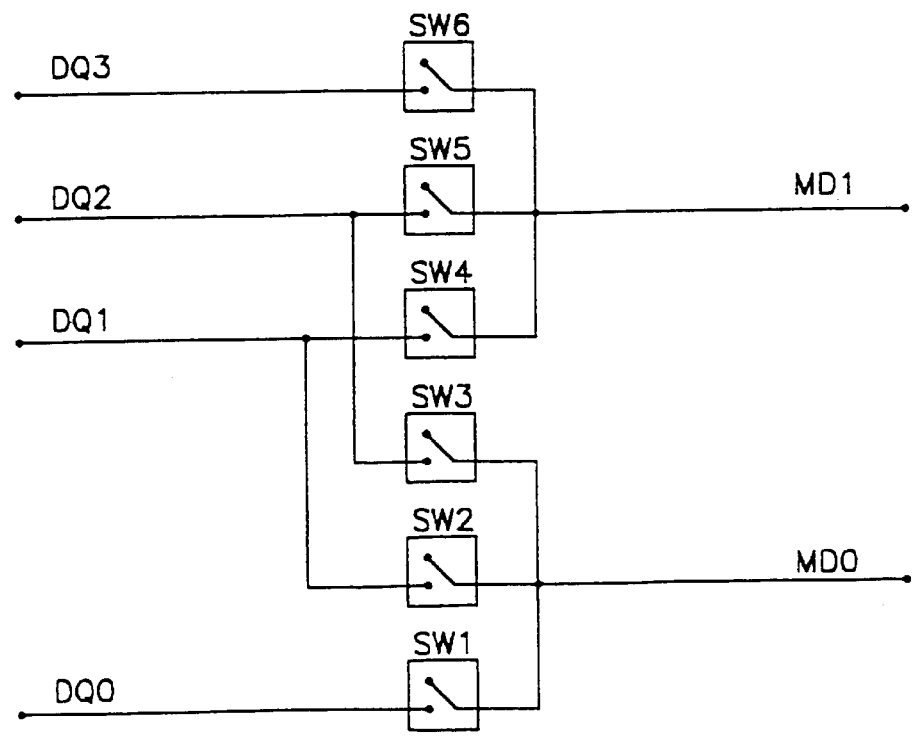
FIG. 4 shows another mapping example of the switch circuit in the present invention.

For clarifying and simplifying the explanation to make it easier to understand, two examples of partially defective memory devices each having four I/O data bits are illustrated in FIG. 3 and FIG. 4. However, it is well understood that any number of I/O data bits of the memory devices could be used. FIG. 3 shows that four I/O data bits DQ3, DQ2, DQ1 and DQ0 of a partially defective memory device (not shown) are routed via switches SW1, SW2 . . . and SW6, thus generating mapped data bits MD0, MD1 and MD2. In the case of the failed bit DQ3, the switches SW2, SW4 and SW6 are opened and the switches SW1, SW3 and SW5 are closed, therefore coupling DQ2 to MD2, DQ1 to MD1 and DQ0 to MD0 respectively. The opening or closing of the switches are controlled by the data signals of the switch data register 26 (FIG. 2) through a switch data bus 27. In the same manner shown above, if the bit DQ2, DQ1 or DQ0 is defective, then the corresponding conditions of the switches are summarized in TABLE 1.

TABLE 1

|  | defective DQ3 | defective DQ2 | defective DQ1 | defective DQ0 |
| --- | --- | --- | --- | --- |
| SW1 | close | close | close | open |
| SW2 | open | open | open | close |
| SW3 | close | close | open | open |
| SW4 | open | open | close | close |
| SW5 | close | open | open | open |
| SW6 | open | close | close | close |

FIG. 4 shows another simplified example for a partially defective memory device, which has at most two defective I/O data bits out of four bits DQ0, DQ1, DQ2 and DQ3. As can be seen from FIG. 4, mapped data bit MD1 is connected to one of the three bits DQ1, DQ2 and DQ3, in which at most two bits are defective. In the same way, mapped data bit MD0 is connected to one of the three bits DQ0, DQ1 and DQ2, in which at most two bits are failed. In the case of failed DQ1 and DQ3, the switches SW2, SW3, SW4 and SW6 are opened, and the other switches are closed, thus coupling DQ2 to MD1, and DQ0 to MD0.

In general, for remapping a partially defective memory device with m total I/O data bits to n mapped data bits, supposing that the maximum number of failed data bits is (m−n), the number of required switches is at least n [(m−n)+1]. For example, for the situation in FIG. 3, 6 switches, i.e., 3[(4−3)+1] are needed, and for the situation in FIG. 4, 6 switches, i.e., 2[(4−2)+1] are required.

Figure 5:
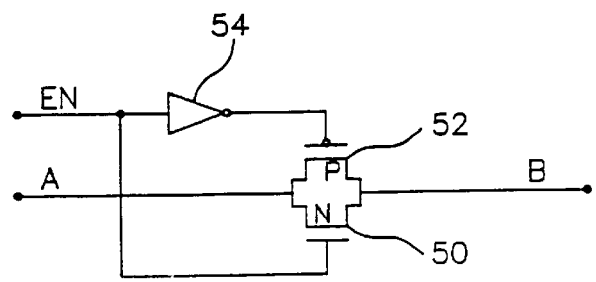
FIG. 5 shows one complementary metal-oxide-semiconductor (CMOS) transistor for implementing the switch of the switch circuit.

While the number m of the I/O data bits for the defective memory device increases, the implementation of the switches circuit becomes impratical using conventional mechanical switches, such as DIP switches or jumpers. FIG. 5 shows one realization for implementing one of the switches in the switch circuit. A complementary metal-oxide-semiconductor (CMOS) transistor includes a N type MOS (NMOS) transistor 50 and a P type MOS (PMOS) transistor 52. The coupled source electrodes as an input of this CMOS transistor 50 and 52 is connected to a I/O data bits A, and the coupled drain electrodes as an output is connected to a mapped data bit B. Further, the gates of the CMOS transistor 50 and 52 are controlled by an enable signal EN and an inverted enable signal (by an inverter 54) respectively for the NMOS transitor 50 and the PMOS transistor 52. When the signal EN is low, the NMOS transistor 50 and the PMOS transistor 52 are in OFF condition, disconnecting I/O data bit A and the mapped bit B. On the contrary, when the enable signal EN is asserted high, the the NMOS transistor 50 and the PMOS transistor 52 are in ON condition, connecting I/O data bit A and the mapped bit B.

Figure 6:
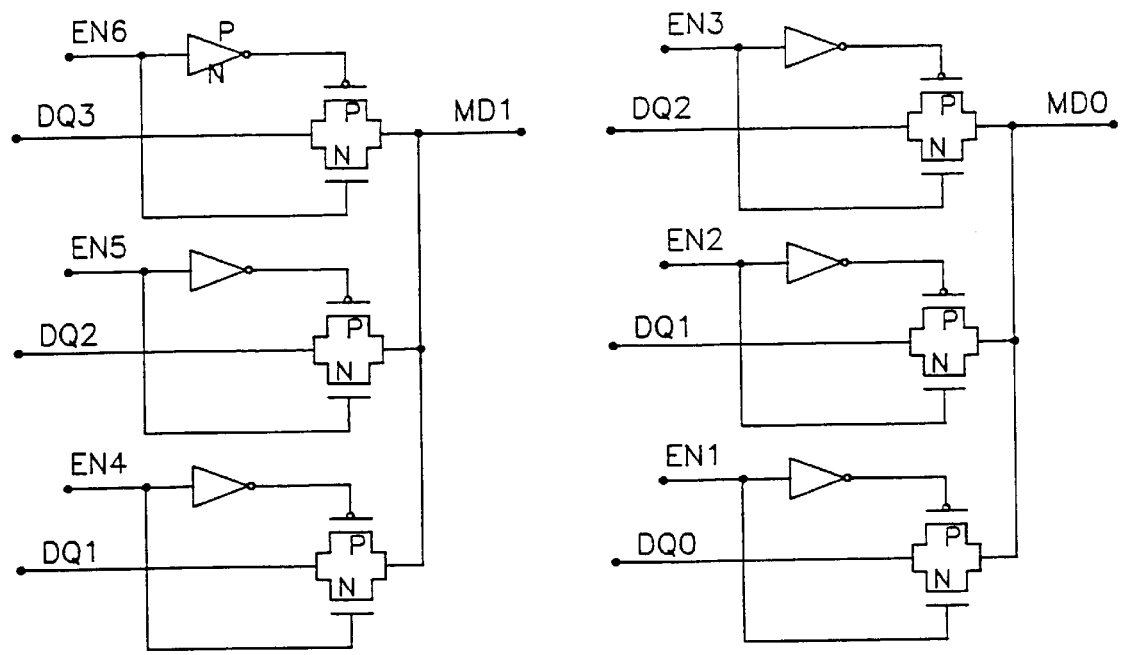
FIG. 6 shows the implementation of FIG. 4 using CMOS transistors.

FIG. 6 shows the realization using the electrical switch of FIG. 5 for implementing the mapping demonstrated in FIG. 4. The enable signals EN1, EN2, . . . and EN6 are predetermined through a memory testing, which can be done by a conventional software method or hardware method, and are placed on the switch data register 26 (FIG. 2). For example, if bits DQ1 and DQ3 are failed, the enable signals EN6 to EN1 are predetermined and placed as (0100001) on the switch data register 26.

Figure 7:
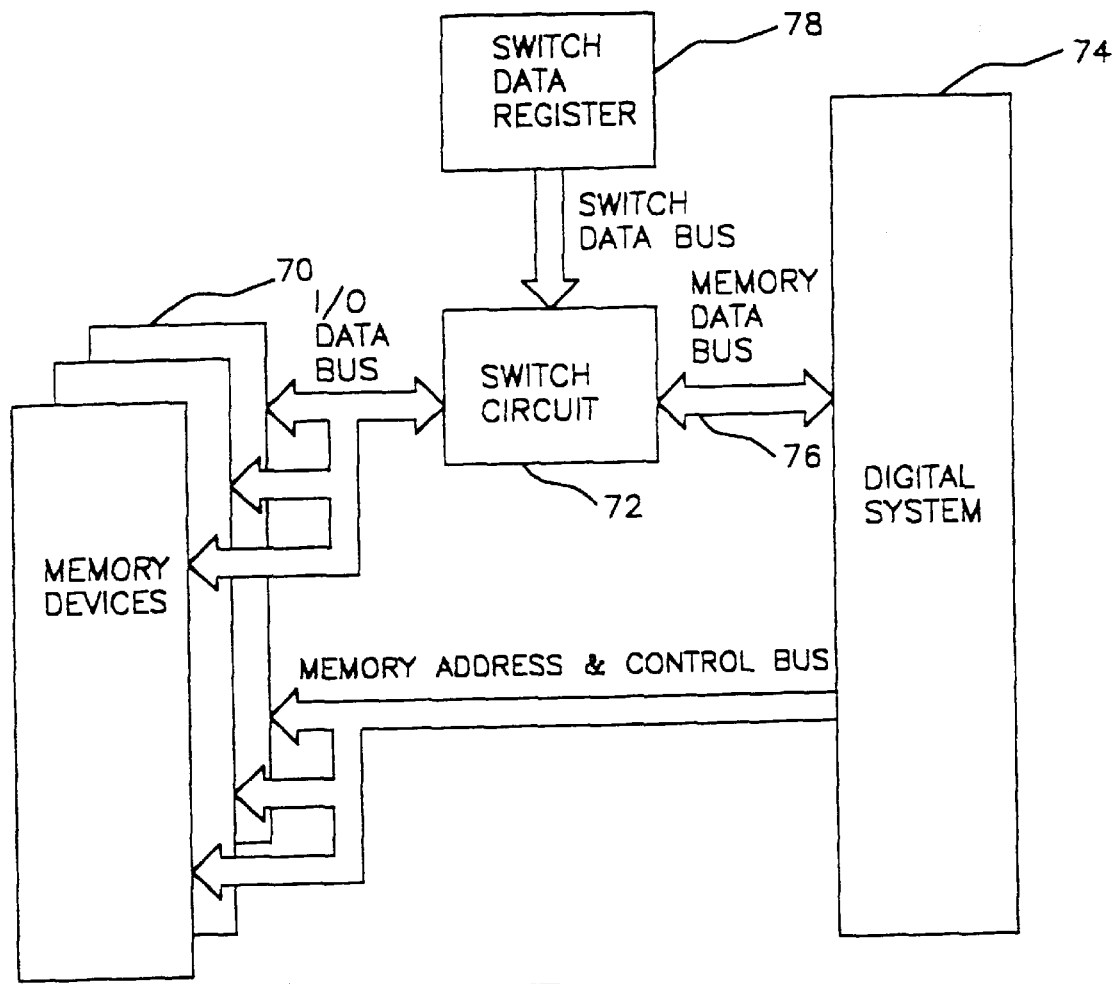
FIG. 7 shows the block diagram of the preferred embodiment for the present invention.

FIG. 7 shows the block diagram of the preferred embodiment for the present invention. An array of partially defective memory devices 70 is transformed through a switch circuit 72, also referred to as a programmable I/O remapper, and the functional I/O data bits of the memory devices 70 are then connected to a digital system 74 via a memory data bus 76. The switch data register 78, usually a non-volatile memory device such as a read only memory (ROM), a programmable ROM (PROM), an erasable PROM (EPROM), an electrically EPROM (EEPROM), a flash ROM, or any of these in combination stores the required enable signals for the switches of the switch circuit 72. Furthermore, a control circuit (not shown) is used to write those enable signals into the switch data register 78 before configuring the switch circuit 72 or reconfiguring the switch circuit 72 before replacing some or all of the memory devices 70.

According to the present invention, the functional I/O data bits of the partially defective memory devices are routed to the memory data bus 76 of the digital system 74, therefore recycling those defective memory devices, reducing the cost for fabricating electronic system without compromising the performance of the system.

Although specific embodiments have been illustrated and described it will be obvious to those skilled in the art that various modification may be made without departing from the spirit which is intended to be limited solely by the appended claims.

What is claimed is:

1. Apparatus for mapping a partially defective memory device to a memory data bus of an electronic system, said apparatus comprising:

memory means responsive to a plurality of control signals and a plurality of address signals of the electronic system, said memory means having a plurality of data bits, said plurality of data bits comprising at least one defective data bit, and at least one non-defective data bit;

switch means comprising a plurality of switches for generating a plurality of mapped data bits coupled to the memory data bus of the electronic system, said plurality of switches directly coupling said at least one non-defective data bit to the memory data bus, wherein the number of the mapped data bits is not greater than the number of the non-defective data bits of said memory means; and register means for storing a plurality of enable signals, the plurality of said enable signals being coupled to said switch means to control the plurality of switches of said switch means.

2. The apparatus according to claim 1, wherein said memory means comprises at least one memory device.

3. The apparatus according to claim 2, wherein said at least one memory device of said memory means is selected from the group consisting of a dynamic random access memory, a static random access memory, a read only memory, a programmable read only memory, an erasable programmable read only memory, an electrically erasable programmable read only memory, a flash read only memory, and any combination thereof.

4. The apparatus according to claim 1, wherein said register means comprises a memory device.

5. The apparatus according to claim 4, wherein the memory device of said register means is a non-volatile type memory device.

6. The apparatus according to claim 5, wherein the memory device of said register means is selected from the group consisting of a read only memory, a programmable read only memory, an erasable programmable read only memory, an electrically erasable programmable read only memory, a flash read only memory, and any combination thereof.

7. The apparatus according to claim 1, wherein the switch of said switch means is an electrical type switch.

8. The apparatus according to claim 7, wherein the switch of said switch means comprises a complementary metal-oxide-semiconductor (CMOS) transistor comprising a P type metal-oxide-semiconductor (PMOS) transistor and a N type metal-oxide-semiconductor (NMOS) transistor, drain electrodes of both said PMOS transistor and said NMOS transistor being connected, source electrodes of both said PMOS transistor and said NMOS transistor being connected, gate electrode of said PMOS transistor being controlled by one of the enable signals of said register means, gate electrode of said NMOS transistor being controlled by an inverted signal of the enable signals of said register means.

9. The apparatus according to claim 1, wherein each of the mapped data bits is mapped from a portion of the data bits of said memory means, the number of the portion of the data bits is at least equal to the number of the total data bits minus the number of the mapped data bits plus one.

10. The apparatus according to claim 1, further comprising control means for writing the enable signals to said register means.

11. Apparatus for mapping a partially defective memory device to a memory data bus of an electronic system, said apparatus comprising:

at least one memory device responsive to a plurality of control signals and a plurality of address signals of the electronic system, said memory device having a plurality of data bits, said plurality of data bits comprising at least one defective data bit, and at least one non-defective data bit;

a switch circuit comprising a plurality of electronic type switches for generating a plurality of mapped data bits coupled to the memory data bus of the electronic system, said plurality of switches directly coupling said at least one non-defective data bit to the memory data bus, wherein the number of the mapped data bits is not greater than the number of the non-defective data bits of said memory device; and a data register for storing a plurality of enable signals, the plurality of said enable signals being coupled to said switch circuit to control the plurality of switches of said switch circuit.

12. The apparatus according to claim 11, wherein said at least one memory device is selected from the group consisting of a dynamic random access memory, a static random access memory, a read only memory, a programmable read only memory, an erasable programmable read only memory, an electrically erasable programmable read only memory, a flash read only memory, and any combination thereof.

13. The apparatus according to claim 11, wherein said data register is a non-volatile type register.

14. The apparatus according to claim 13, wherein said data register is selected from the group consisting of a read only memory, a programmable read only memory, an erasable programmable read only memory, an electrically erasable programmable read only memory, a flash read only memory, and any combination thereof.

15. The apparatus according to claim 11, wherein the switch of said switch circuit comprises a complementary metal-oxide-semiconductor (CMOS) transistor comprising a P type metal-oxide-semiconductor (PMOS) transistor and a N type metal-oxide-semiconductor (NMOS) transistor, drain electrodes of both said PMOS transistor and said NMOS transistor being connected, source electrodes of both said PMOS transistor and said NMOS transistor being connected, gate electrode of said PMOS transistor being controlled by one of the enable signals of said data register, gate electrode of said NMOS transistor being controlled by an inverted signal of the enable signals of said data register.

16. The apparatus according to claim 11, wherein each of the mapped data bits is mapped from a portion of the data bits of said memory device, the number of the portion of the data bits is at least equal to the number of the total data bits minus the number of the mapped data bits plus one.

17. The apparatus according to claim 11, further comprising control means for writing the enable signals to said data register.

\* \* \* \* \*